US010257929B2

(12) United States Patent
Lim et al.

(10) Patent No.: US 10,257,929 B2
(45) Date of Patent: Apr. 9, 2019

(54) VARIABLE STIFFNESS FILM, VARIABLE STIFFNESS FLEXIBLE DISPLAY, AND METHOD OF MANUFACTURING THE VARIABLE STIFFNESS FILM

(71) Applicant: Samsung Electronics Co., Ltd., Suwon-si (KR)

(72) Inventors: Soo Chul Lim, Seoul (KR); Joon Ah Park, Seoul (KR); Hyun Jeong Lee, Hwaseong-si (KR); Seung Ju Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 76 days.

(21) Appl. No.: 14/454,114

(22) Filed: Aug. 7, 2014

(65) Prior Publication Data

US 2015/0055308 A1 Feb. 26, 2015

(30) Foreign Application Priority Data

Aug. 22, 2013 (KR) ........................ 10-2013-0099480

(51) Int. Cl.
*H05K 1/03* (2006.01)
*G06F 3/045* (2006.01)
(Continued)

(52) U.S. Cl.
CPC ......... *H05K 1/0393* (2013.01); *G04G 17/045* (2013.01); *G04G 21/08* (2013.01);
(Continued)

(58) Field of Classification Search
CPC .............. H05K 1/0393; H05K 1/0277; H05K 2201/0195; H05K 2203/105;
(Continued)

(56) References Cited

U.S. PATENT DOCUMENTS 4,923,057 A * 5/1990 Carlson ................... E04B 1/98
188/267.1
5,068,018 A * 11/1991 Carlson .................. G05B 19/02
188/267.1
(Continued)

FOREIGN PATENT DOCUMENTS

KR 10-2010-0113869 10/2010
KR 10-2011-0006787 1/2011

OTHER PUBLICATIONS

Yvonne Jansen, Thorsten Karrer, Jan Borchers; MudPad: Tactile Feedback and Haptic Texture Overlay for Touch Surfaces, Nov. 7-10, 2010, ITS 2010: Displays, pp. 11-14.*

*Primary Examiner* — Temesghen Ghebretinsae
*Assistant Examiner* — Ivelisse Martinez Quiles
(74) *Attorney, Agent, or Firm* — NSIP Law

(57) ABSTRACT

A variable stiffness film, a variable stiffness flexible display, and a manufacturing method thereof may include a lower electrode, a variable fluid, and an upper electrode. A polymer layer may be formed on the lower electrode, and a variable fluid receiving portion is patterned on the polymer layer. A variable stiffness layer is formed by putting a variable fluid in the variable fluid receiving portion. The upper electrode is formed on the variable fluid layer.

12 Claims, 20 Drawing Sheets

(51) Int. Cl.
*G06F 3/044* (2006.01)
*G06F 1/16* (2006.01)
*G04G 17/04* (2006.01)
*G04G 21/08* (2010.01)
*H05K 1/02* (2006.01)

(52) U.S. Cl.
CPC ............ *G06F 1/1652* (2013.01); *G06F 3/044* (2013.01); *G06F 3/045* (2013.01); *H05K 1/0277* (2013.01); *G06F 2203/04102* (2013.01); *H05K 2201/0187* (2013.01); *H05K 2201/0195* (2013.01); *H05K 2201/0326* (2013.01); *H05K 2201/057* (2013.01); *H05K 2201/10128* (2013.01); *H05K 2201/10151* (2013.01); *H05K 2203/104* (2013.01); *H05K 2203/105* (2013.01)

(58) Field of Classification Search
CPC ..... H05K 2201/0187; H05K 2203/104; H05K 2201/10128; H05K 2201/10151; H05K 2201/0326; H05K 2201/057; H05K 2201/032; G06F 3/044; G06F 1/1652; G06F 3/045; G06F 2203/04102; G06F 3/041; G06F 3/0412; G06F 3/046; G04G 17/045; G04G 21/08
See application file for complete search history.

(56) References Cited

U.S. PATENT DOCUMENTS

| | | | |
|---|---|---|---|
| 5,810,126 A * | 9/1998 | Kordonsky | B32B 33/00 188/267 |
| 8,047,849 B2 * | 11/2011 | Ahn | G09B 21/003 434/112 |
| 8,120,840 B1 | 2/2012 | Choi et al. | |
| 2005/0285846 A1 * | 12/2005 | Funaki | G06F 3/04886 345/173 |
| 2006/0099808 A1 * | 5/2006 | Kondo | 438/674 |
| 2007/0152974 A1 * | 7/2007 | Kim | G06F 3/016 345/168 |
| 2007/0241002 A1 | 10/2007 | Wu et al. | |
| 2008/0018603 A1 * | 1/2008 | Baraz | G06F 1/1615 345/168 |
| 2012/0038563 A1 * | 2/2012 | Park | G06F 3/0414 345/173 |
| 2012/0127122 A1 | 5/2012 | Lim | |
| 2012/0299905 A1 * | 11/2012 | Roselier | F15B 15/00 345/214 |
| 2012/0313862 A1 | 12/2012 | Ko et al. | |
| 2014/0015402 A1 * | 1/2014 | Ahn et al. | H05B 33/02 313/511 |
| 2014/0320396 A1 * | 10/2014 | Modarres | G06F 3/0412 345/156 |
| 2014/0320431 A1 * | 10/2014 | Cruz-Hernandez | G06F 3/041 345/173 |

* cited by examiner

VARIABLE STIFFNESS FILM, VARIABLE STIFFNESS FLEXIBLE DISPLAY, AND METHOD OF MANUFACTURING THE VARIABLE STIFFNESS FILM

CROSS-REFERENCE TO RELATED APPLICATIONS

This application claims the priority benefit of Korean Patent Application No. 10-2013-0099480, filed on Aug. 22, 2013, in the Korean Intellectual Property Office, the disclosure of which is incorporated herein by reference.

BACKGROUND

1. Field

One or more example embodiments of the following description relate to a variable stiffness film, a variable stiffness flexible display, and a method for manufacturing the variable stiffness film.

2. Description of the Related Art

A flexible display is capable of bending and rolling without sustaining damage through the medium of a paper-like thin and flexible substrate. The flexible display is a strategic technology in a ubiquitous computing age where information is accessible anytime and anywhere. The flexible display uses plastic, film, and the like instead of glass as a material for the substrate. A market of the flexible display is expanding in a small display such as a watch, sports goods, electronic books, and the like. In addition, the flexible displays are being quickly commercialized in fields demanding a high performance flexible display, such as a mobile terminal, a document viewer, an e-paper display, and the like.

SUMMARY

A variable stiffness flexible display may be used as a flexible display, a semi-rigid display, and a rigid display. The variable stiffness flexible display may be quickly customized by the user to be flexibly formed into a particular shape, and then hold the shape. As an example, a user might form the display, in a flexible state, into the shape of a wristwatch. Once the desired wristwatch shape is attained, the user might provide an input to place the display into a rigid state such that the wristwatch shape is maintained. Later, the user might wish to provide an input to place the display into a flexible state, and form the display into a flat shape to view the display in a conventional flat display manner. However, the disclosure is not limited thereto, and the display may be formed into various other shapes to accommodate various other uses.

The variable stiffness flexible display may include an electro-rheological (ER) fluid or a magneto-rheological (MR) fluid, of which physical characteristics may be adjusted based on an electrical field or a magnetic field, respectively. In case of the ER fluid, viscosity is increased when a voltage of an applied electrical field is increased. Upon application of the electrical field, particles in the ER fluid are arranged into a chain, which changes the viscosity of the ER fluid. When the viscosity is increased, the rigidity of the ER fluid is increased. Thus, the ER fluid having electrical characteristics in which the viscosity is changed according to the electrical field may be attached to a back surface of the flexible display, to vary the stiffness of the flexible display. Also, if a transparent ER fluid is used, the ER fluid may be attached to a front surface of the flexible display.

According to example embodiments, a variable stiffness film may include a variable stiffness layer including a lower electrode; a variable fluid layer disposed on the lower electrode; and an upper electrode disposed on the variable fluid layer, wherein the variable fluid layer may include a variable fluid receiving portion to receive a variable fluid, and the variable fluid has stiffness when an electric field or magnetic field is generated between the upper electrode and the lower electrode.

The variable fluid layer may include a plurality of variable fluid receiving portions patterned to be parallel with each other and configured to receive the variable fluid, and patterns of a plurality of supporting polymers to support the plurality of variable fluid receiving portions. The variable stiffness layer may include a first variable stiffness layer, a second variable stiffness layer, and a polymer separation layer disposed between the first variable stiffness layer and the second variable stiffness layer. A variable fluid receiving portion of the first variable stiffness layer and a variable fluid receiving portion of the second variable stiffness layer may be arranged orthogonal to each other. The first variable stiffness layer and the second variable stiffness layer may be controllable to have stiffness, respectively. The lower electrode and the upper electrode may be shaped corresponding to the plurality of variable fluid receiving portions, and a remaining portion of the variable stiffness film, excluding the lower electrode, the variable fluid receiving portions disposed on the lower electrode, and the upper electrode disposed on the variable fluid receiving portions, may be all the supporting polymers.

The variable fluid may be an electro-rheological (ER) fluid or a magneto-rheological (MR) fluid. The lower electrode and the upper electrode may each include indium tin oxide (ITO), indium zinc oxide (IZO), tin antinomy oxide (TAO), tin oxide (TO), zinc oxide (ZnO), graphene, carbon nanotube (CNT), and silver nanowire. The variable stiffness film may further include a polymer layer disposed on at least one of the upper electrode and the lower electrode. The variable stiffness film may further include sealing portions disposed on opposite sides of the variable fluid layer.

According to example embodiments, a variable stiffness flexible display may include a flexible display, where the variable stiffness film is disposed to be in contact with the flexible display.

According to example embodiments, a variable stiffness flexible touch sensor may include a flexible display and a touch sensor, where the variable stiffness film is disposed to be in contact with the touch sensor.

According to example embodiments, a manufacturing method for a variable stiffness film includes forming a polymer layer on a lower electrode, patterning a variable fluid receiving portion on the polymer layer, forming a variable fluid layer by putting a variable fluid in the variable fluid receiving portion, and forming an upper electrode on the variable fluid layer. The patterning may include patterning a plurality of variable fluid receiving portions arranged in parallel with each other. The lower electrode may be shaped corresponding to the variable fluid receiving portions, spaces between the lower electrodes are filled with polymer, and the forming of the upper electrode may include forming the upper electrode to correspond to the variable fluid receiving portions.

The manufacturing method may further include, after the forming of the upper electrode, forming a polymer separation layer on the upper electrode, forming a second lower electrode on the polymer separation layer, forming a second polymer layer on the second lower electrode, patterning a plurality of second variable fluid receiving portions arranged in parallel with each other, in a direction orthogonal to the plurality of variable fluid receiving portions, forming a second variable fluid layer by putting a variable fluid in the second variable fluid receiving portions, and forming a second upper electrode on the second variable fluid layer.

The second lower electrode may be shaped corresponding to the second variable fluid receiving portions, spaces between the second lower electrodes are filled with polymer, and the forming of the second upper electrode may include forming the second upper electrode to correspond to the second variable fluid receiving portions.

Additional aspects, features, and/or advantages of example embodiments will be set forth in part in the description which follows and, in part, will be apparent from the description, or may be learned by practice of the disclosure.

BRIEF DESCRIPTION OF THE DRAWINGS

These and/or other aspects and advantages will become apparent and more readily appreciated from the following description of the example embodiments, taken in conjunction with the accompanying drawings of which.

DETAILED DESCRIPTION

Figure 1:
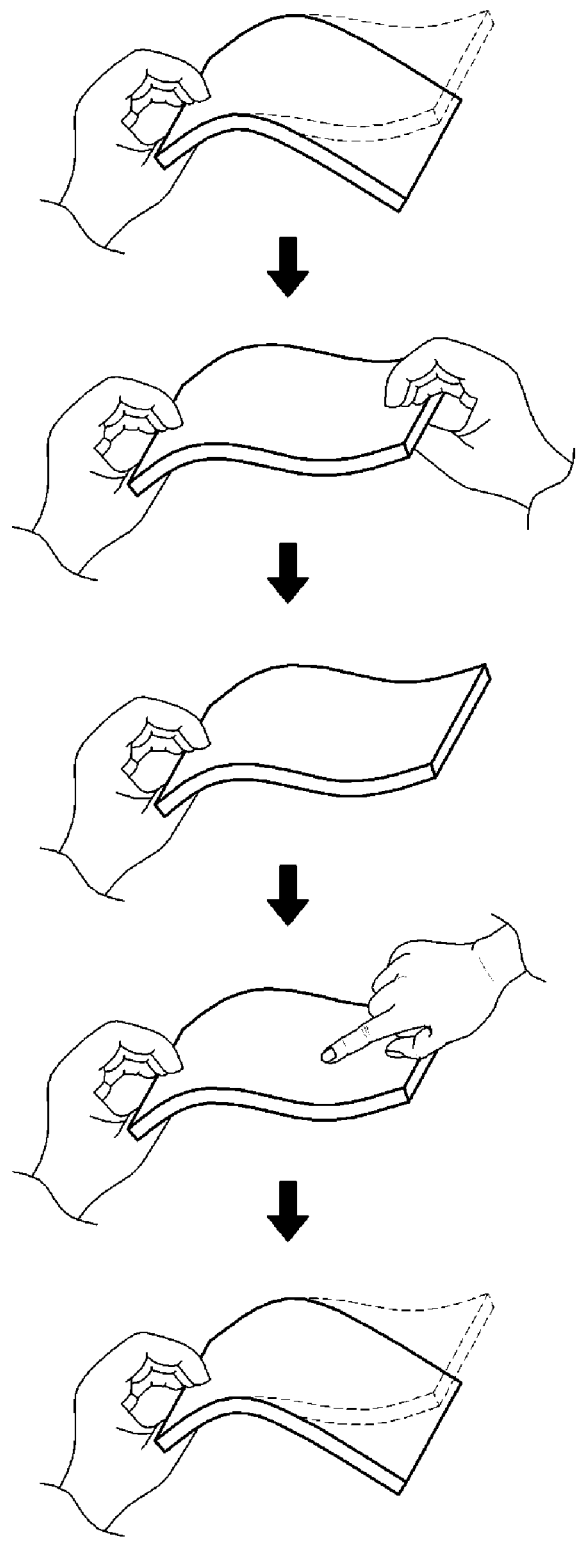
FIG. 1 illustrates a screen manipulation method using a variable stiffness flexible display according to example embodiments.

Reference will now be made in detail to example embodiments, examples of which are illustrated in the accompanying drawings, wherein like reference numerals refer to like elements throughout.

Throughout the specification, when one part is referred to as being 'connected' to another part, it should be understood that the former can be 'directly connected' to the latter, or 'electrically connected' to the latter via an intervening part or element.

It will also be understood that when a member is referred to as being 'on' another member, the former can be in direct contact with the latter, or intervening layers may also be present between the members.

Throughout this specification, the term "comprising" or "comprises" refers to including the component(s) specified but not to the exclusion of the presence of others. Hereinafter, example embodiments will be described with reference to the accompanying drawings.

FIG. 1 illustrates a screen manipulation method using a variable stiffness flexible display according to example embodiments.

As shown in a first drawing of FIG. 1, the variable stiffness flexible display may normally flexibly transform throughout. In a second drawing of FIG. 1, the variable stiffness flexible display is transformed into a specific desired form. As shown in a third drawing of FIG. 1, the rigidity of the variable stiffness flexible display may be increased using an electro-rheological (ER) fluid or a magneto-rheological (MR) fluid provided in the variable stiffness flexible display.

In general, ER fluid refers to a fluid of which mechanical characteristics are changed according to intensity of an electric field. In general, the ER fluid may be a colloidal solution prepared by distributing conductive particles in a nonconductive solvent. The ER fluid has characteristics of a Newtonian fluid having a random structure when the electric field is not generated, and a Bingham fluid having a yield shear stress when the electric field is generated. The ER fluid has reversible fluidity which may quickly change to a liquid state or solid state, and the yield shear stress may be continuously variable based on the intensity of the electric field.

The MR fluid may have mechanical characteristics of the ER fluid, but with variable rigidity based on an intensity of a magnetic field. The MR fluid is prepared by distributing paramagnetic particles in a low permeability solvent.

As shown in a fourth drawing of FIG. 1, the variable stiffness flexible display may adjust the stiffness in a particular shape when an input is made through an external touch by a pointing object, such as a finger, or a stylus pen, for example, applied to a screen of the variable stiffness flexible display. However, the disclosure is not limited to the input being an external touch, and may be any appropriate input. For example, the input may be a voice command or a particular time of day, for example. As shown in a fifth drawing of FIG. 1, when the electric field or magnetic field is removed using the ER fluid or MR fluid, the variable stiffness flexible display returns to the original flexible state of the flexible display.

Figure 2A:
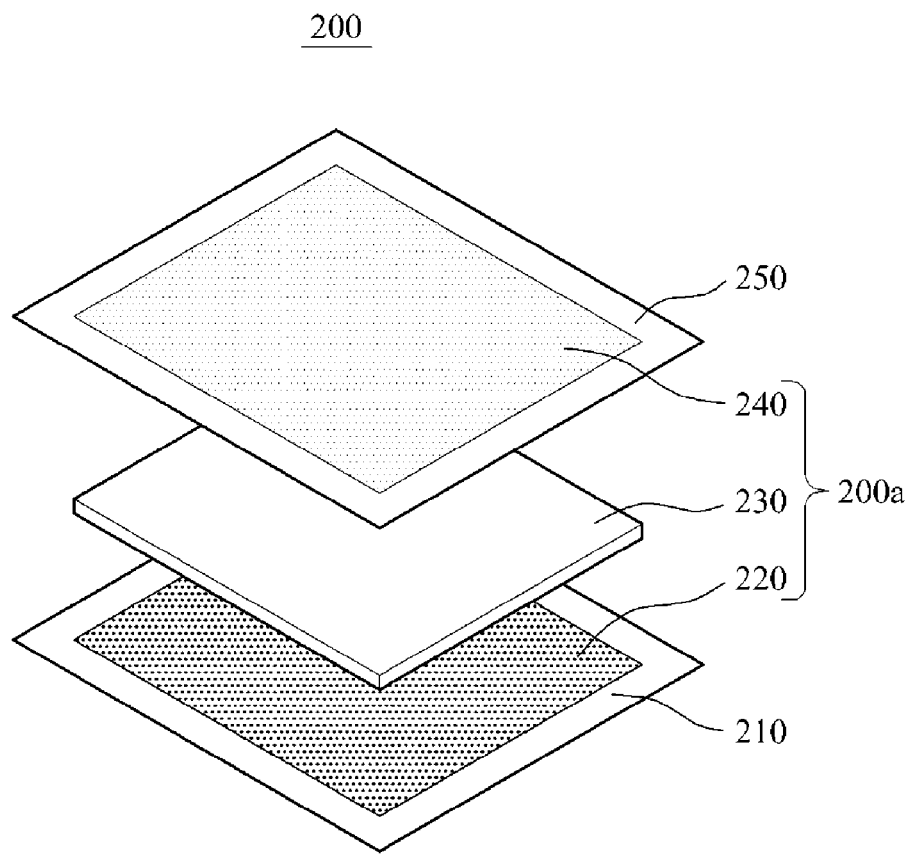
FIG. 2A illustrates a perspective view of a variable stiffness film according to example embodiments.
Figure 2B:
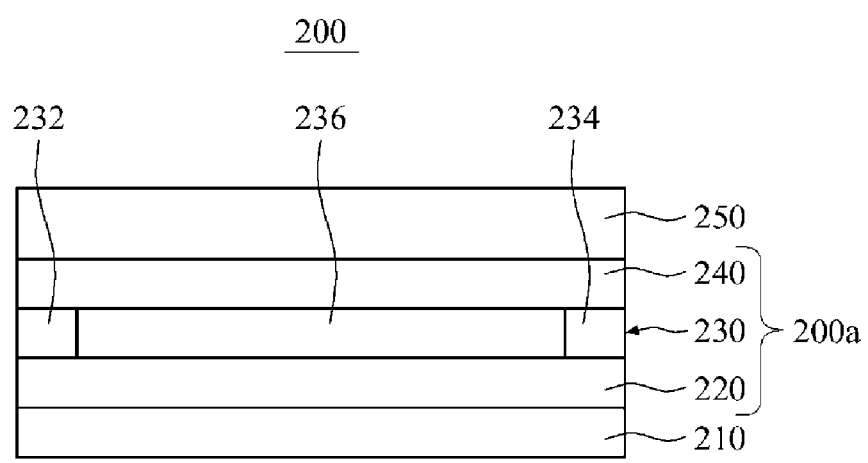
FIG. 2B illustrates a sectional view of a variable stiffness film according to example embodiments.

FIG. 2A illustrates a perspective view of a variable stiffness film 200 according to example embodiments and FIG. 2B illustrates a sectional view of the variable stiffness film 200.

Referring to FIGS. 2A and 2B, the variable stiffness film 200 may include a variable stiffness layer 200a that includes a lower electrode 220, a variable fluid layer 230, and an upper electrode 240. In detail, the variable stiffness film 200 may include the lower electrode 220 disposed on a lower polymer layer 210, the variable fluid layer 230 disposed on the lower electrode 220, the upper electrode 240 disposed on the variable fluid layer 230, and an upper polymer layer 250 disposed on the upper electrode 240.

The variable fluid layer 230 may include a variable fluid receiving portion 236 for receiving a variable fluid. The variable fluid receiving portion 236 may be provided in a recess form. The variable fluid receiving portion 236 may further include sealing portions 232 and 234 disposed on opposite sides of the variable fluid layer 230 to prevent the variable fluid from flowing out.

The variable fluid received in the variable fluid receiving portion 236 may include an electro-rheological (ER) fluid or a magneto-rheological (MR) fluid.

When an electric field or a magnetic field is generated between the lower electrode 220 and the upper electrode 240, the flexibility of the variable fluid disposed between the two electrodes may decrease. When the electric field is formed, viscosity of the ER fluid may be increased. When the magnetic field is generated, viscosity of the MR fluid may be increased, thereby increasing the stiffness. When the electric field or the magnetic field is removed from between the lower electrode 220 and the upper electrode 240, the stiffness of the variable fluid is reduced and therefore the variable fluid returns to a low viscosity state.

The lower polymer layer 210 and the upper polymer layer 250 may independently include a thermosetting resin such as polyimide (PI), polyacryl, polyphenol, polyester, and polyurethane, a thermoplastic resin such as polycarbonate, polyethylene, and polystyrene, benzocyclobutene (BCB), an F-added PI, perfluorocyclobutane (PFCB), fluoropolyaryleether (FPAE), and a siloxane based polymer, for example.

A thickness of each of the lower polymer layer 210 and the upper polymer layer 250 may be approximately 500 µm or less. However, the disclosure is not limited thereto.

The lower polymer layer 210 and the upper polymer layer 250 may each include indium tin oxide (ITO), indium zinc oxide (IZO), tin antinomy oxide (TAO), tin oxide (TO), zinc oxide (ZnO), graphene, carbon nanotube (CNT), and silver nanowire, for example.

The flexibility/rigidity of the variable stiffness flexible display may be continuously variable from a most flexible (least rigid) state with a flexibility/rigidity approximately equal to the flexibility/rigidity of the polymer layer, to a least flexible (most rigid) state with a flexibility/rigidity approximately equal to a conventional (non-flexible) display. The flexibility of the variable stiffness flexible display may be continuously variable proportional to the electric field or the magnetic field. For example, as an intensity of the electric field increases, the rigidity of the variable stiffness flexible display may increase proportionally.

The electric (or magnetic) field may be controlled by a variable input, such as a sliding bar with continuous variability, or by a plurality of buttons with predetermined states of flexibility, or by an amount of pressure applied to an input, for example. However, the disclosure is not limited to the above examples, and any appropriate input may be used to control the rigidity of the variable stiffness flexible display.

Figure 3A:
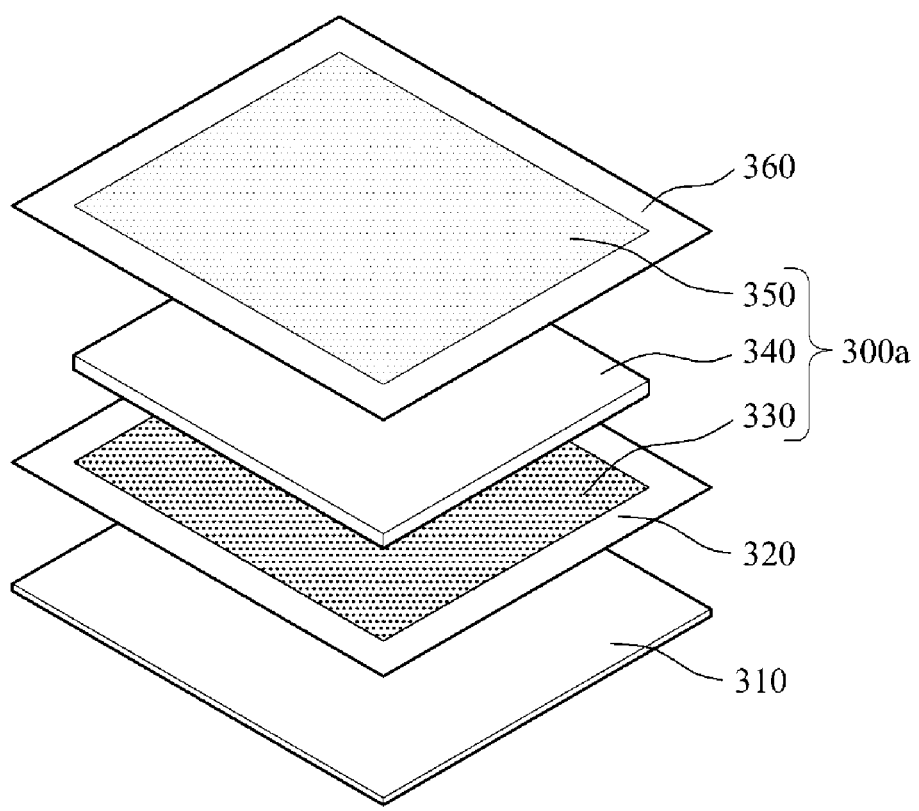
FIG. 3A illustrates a perspective view of a variable stiffness flexible display according to example embodiments.
Figure 3B:
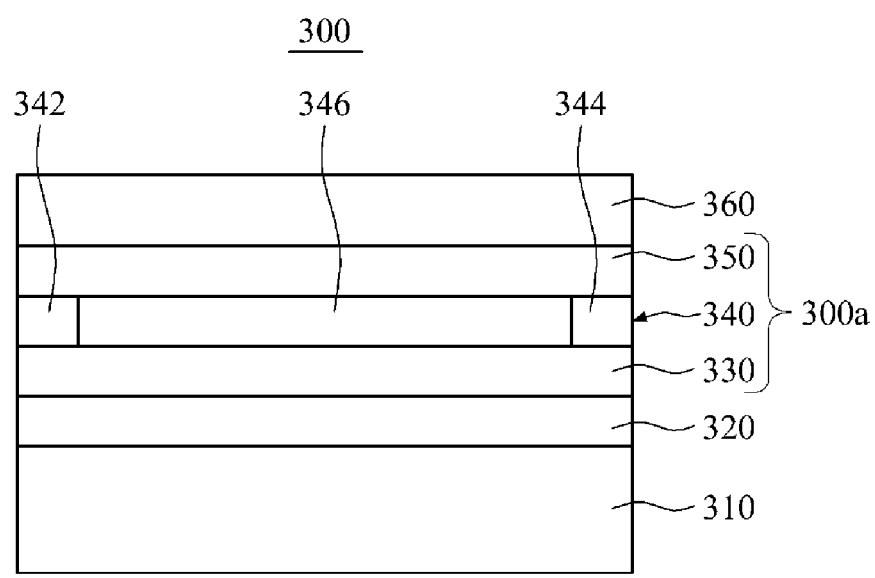
FIG. 3B illustrates a sectional view of a variable stiffness flexible display according to example embodiments.

FIG. 3A illustrates a perspective view of a variable stiffness flexible display 300 according to example embodiments and FIG. 3B illustrates a sectional view of the variable stiffness flexible display 300.

Referring to FIGS. 3A and 3B, the variable stiffness flexible display 300 may include a variable stiffness layer 300a that includes a flexible display 310, a lower electrode 330, a variable fluid layer 340, and an upper electrode 350. In detail, the variable stiffness flexible display 300 may include a lower polymer layer 320 disposed on the flexible display 310, the lower electrode 330 disposed on the lower polymer layer 320, the variable fluid layer 340 dispose on the lower electrode 330, the upper electrode 350 disposed on the variable fluid layer 340, and an upper polymer layer 360 disposed on the upper electrode 350.

The variable fluid layer 340 may include a variable fluid receiving portion 346 for receiving a variable fluid. The variable fluid receiving portion 346 may be provided in a recess form. The variable fluid receiving portion 346 may further include sealing portions 342 and 344 disposed on opposite sides of the variable fluid layer 340 to prevent the variable fluid from flowing out.

The variable stiffness flexible display 300 according to the example embodiments may be equivalent to the variable stiffness film 200 shown in FIGS. 2A and 2B, in which the flexible display 310 is further included. Although FIGS. 3A and 3B show the flexible display 310 disposed on the lower polymer layer 320, the flexible display 310 may be disposed on the upper polymer layer 350.

For example, the flexible display 310 may be a watch, a liquid crystal display (LCD), an organic light emitting diode (OLED), a plasma display panel (PDP), or an e-paper display.

Figure 4A:
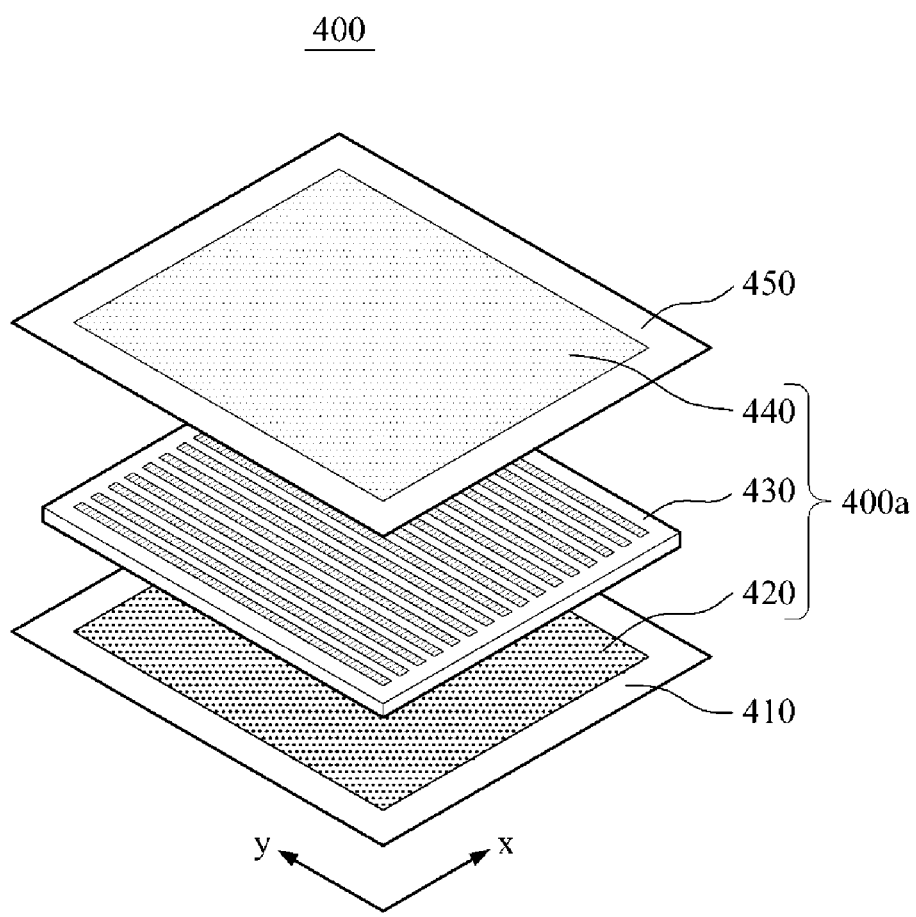
FIG. 4A illustrates a perspective view of a variable stiffness film according to example embodiments.
Figure 4B:
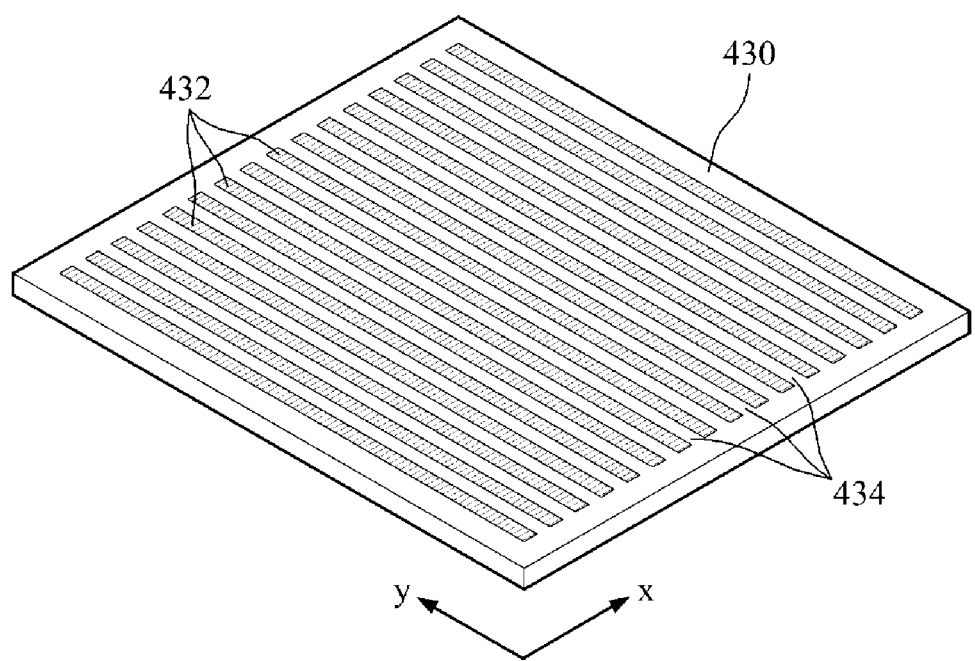
FIG. 4B illustrates a perspective view of a variable fluid layer of a variable stiffness film according to example embodiments.
Figure 4C:
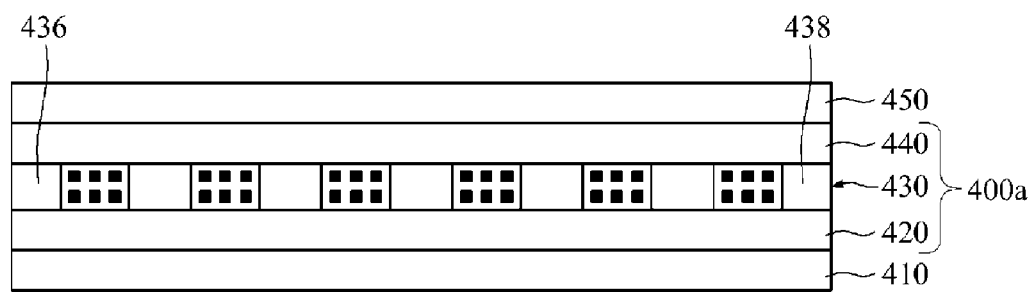
FIG. 4C illustrates a sectional view of a variable stiffness film according to example embodiments.

FIG. 4A illustrates a perspective view of a variable stiffness film 400 according to example embodiments. FIG. 4B illustrates a perspective view of a variable fluid layer 430 of the variable stiffness film 400. FIG. 4C illustrates a sectional view of the variable stiffness film 400.

Referring to FIGS. 4A to 4C, the variable stiffness film 400 according to example embodiments may include a variable stiffness layer 400a that includes a lower electrode 420, the variable fluid layer 430, and an upper electrode 440. In detail, the variable stiffness film 400 may include the lower electrode 420 disposed on a lower polymer layer 410, the variable fluid layer 430 disposed on the lower electrode 420, the upper electrode 440 disposed on the variable fluid layer 430, and an upper polymer layer 450 disposed on the upper electrode 440.

The variable fluid layer 430 may include a plurality of variable fluid receiving portions 432 patterned to be parallel with each other and configured to receive a variable fluid, and supporting polymer patterns 434 for supporting the plurality of variable fluid receiving portions 432. Also, sealing portions 436 and 438 may be formed on opposite sides of the variable fluid layer 430. However, when the variable fluid receiving portions 432 and the supporting polymer patterns 434 are included, sealing portions may be omitted because the supporting polymer patterns 434 may function as the sealing portions.

When an electric field or magnetic field is generated between the lower electrode 420 and the upper electrode 440, the variable fluid of the plurality of variable fluid receiving portions 432 disposed between the lower electrode 420 and the upper electrode 440 may have stiffness. When the electric field is generated, viscosity of an ER fluid may be increased. When the magnetic field is generated, viscosity of an MR fluid may be increased, thereby increasing the stiffness. Because the plurality of variable fluid receiving portions 432 are arranged in a Y-axis direction as shown in FIG. 4B, the stiffness may be increased in the Y-axis direction but may not be significantly changed in an X-axis direction. Therefore, the variable stiffness film 400 may have the stiffness unidirectionally, that is, only in the Y-axis direction. When the electric field or magnetic field is removed from between the lower electrode 420 and the upper electrode 440, the stiffness of the variable fluid is reduced and therefore the variable fluid returns to the low viscosity state. The disclosure is not limited to the arrangement of variable fluid receiving portions 432 of straight parallel lines as illustrated in FIG. 4B. For example, the variable fluid receiving portions 432 may be arranged in a parallel zigzag manner, concentric circles, diagonal lines, or any combination of the above arrangements. The variable fluid receiving portions 432 may be parallel, or may intersect at one or more points along the variable fluid receiving portions 432.

Figure 4D:
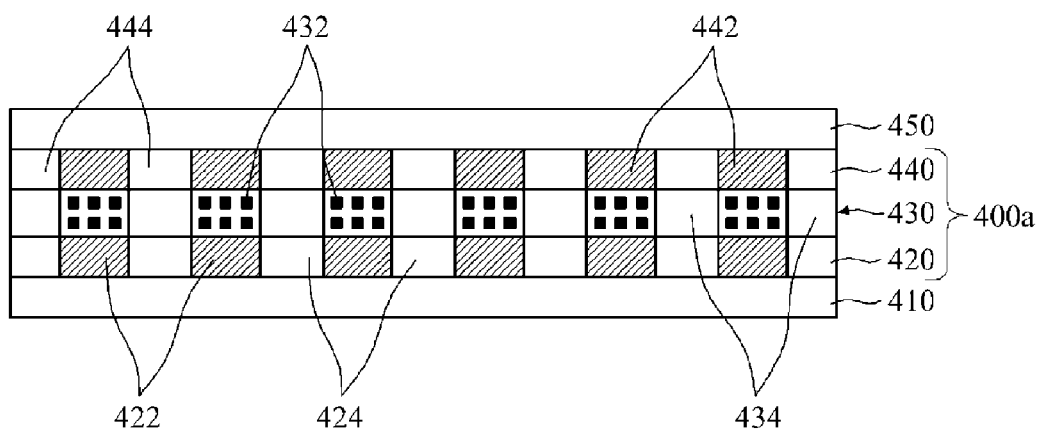
FIG. 4D illustrates a sectional view of a modified version of a variable stiffness film according to example embodiments.

FIG. 4D illustrates a sectional view of a modified version of the variable stiffness film 400. As shown in FIG. 4D, the lower electrode 420 and the upper electrode 440 may be shaped corresponding to the plurality of variable fluid receiving portions 432. The lower electrode 420 may include patterned lower electrodes 422 patterned to correspond to the plurality of variable fluid receiving portions 432, and supporting polymers 424 disposed between the patterned lower electrodes 422. The upper electrode 440 may include patterned upper electrodes 442 patterned to correspond to the plurality of variable fluid receiving portions 432, and supporting polymers 444 disposed between the patterned upper electrodes 442. Accordingly, a remaining portion of the variable stiffness film, excluding the patterned lower electrodes 422, the variable fluid receiving portions 432 disposed on the lower electrode 420, and the patterned upper electrodes 442 disposed on the variable fluid receiving portions 432, may be all the supporting polymers 424, 434, and 444.

Figure 5A:
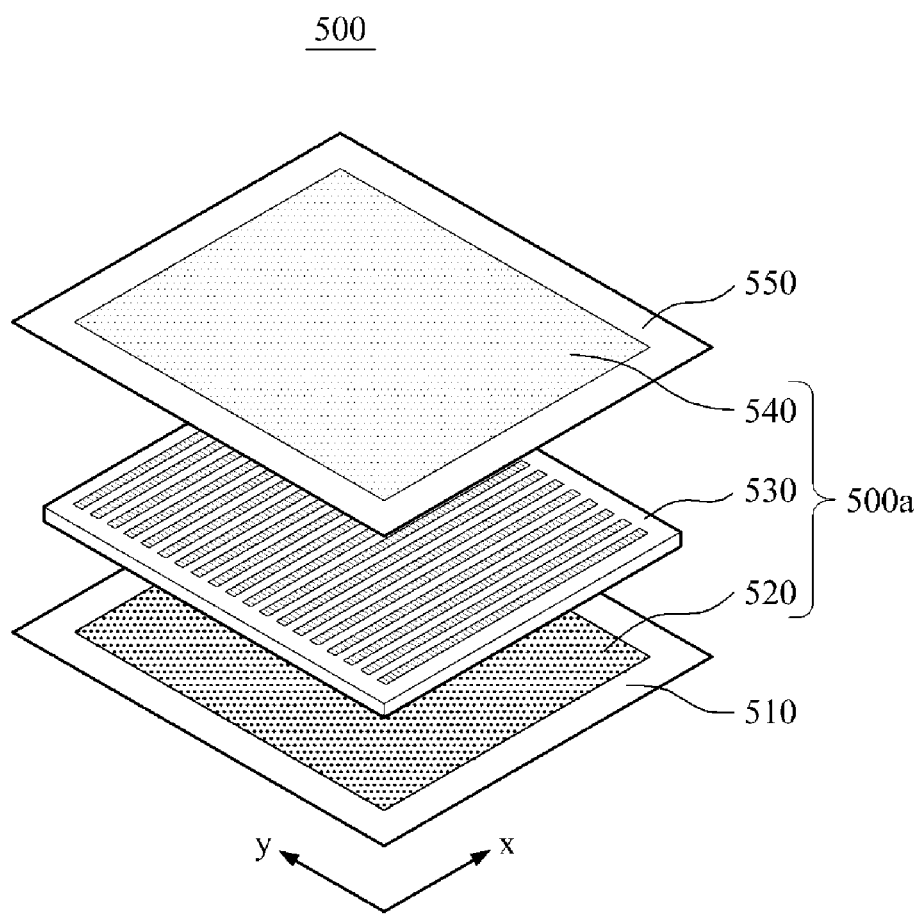
FIG. 5A illustrates a perspective view of a variable stiffness film according to example embodiments.
Figure 5B:
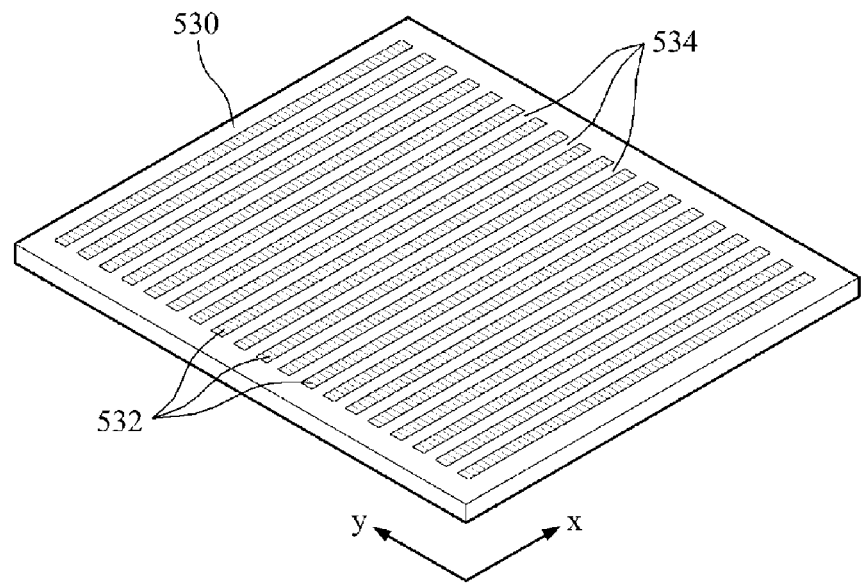
FIG. 5B illustrates a perspective view of a variable fluid layer of a variable stiffness film according to example embodiments.
Figure 5C:
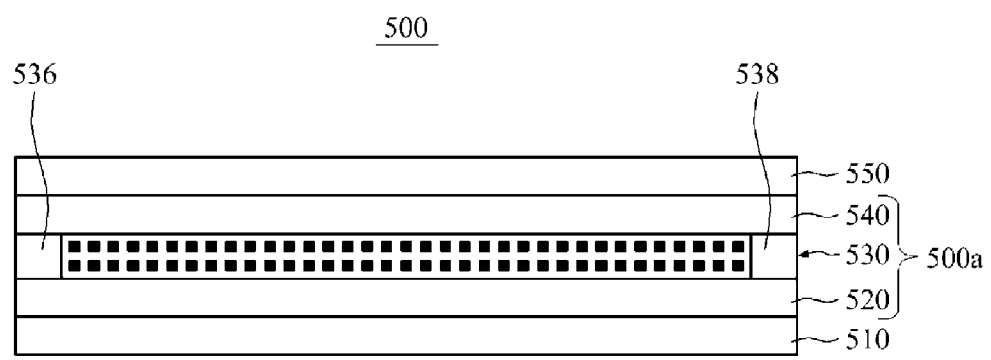
FIG. 5C illustrates a sectional view of a variable stiffness film according to example embodiments.

FIG. 5A illustrates a perspective view of a variable stiffness film 500 according to example embodiments. FIG. 5B illustrates a perspective view of a variable fluid layer 530 of the variable stiffness film 500. FIG. 5C illustrates a sectional view of the variable stiffness film 500.

Referring to FIGS. 5A to 5C, the variable stiffness film 500 may include a variable stiffness layer 500a that includes a lower electrode 520, the variable fluid layer 530, and an upper electrode 540. In detail, the variable stiffness film 500 may include the lower electrode 520 disposed on a lower polymer layer 510, the variable fluid layer 530 disposed on the lower electrode 520, sealing portions 536 and 538 disposed at opposite sides of the variable fluid layer 530, the upper electrode 540 disposed on the variable fluid layer 530, and an upper polymer layer 550 disposed on the upper electrode 540. The variable fluid layer 530 may include a plurality of variable fluid receiving portions 532 patterned to be parallel with each other and configured to receive a variable fluid, and supporting polymer patterns 534 for supporting the plurality of variable fluid receiving portions 532.

In the variable stiffness film 500, different from the variable stiffness film 400 shown in FIGS. 4A to 4C, the plurality of variable fluid receiving portions 532 are arranged in the X-axis direction. Therefore, the stiffness increases in the X-axis direction but is not significantly changed in the Y-axis direction. As a result, the variable stiffness film 500 may have the stiffness unidirectionally, that is, only in the X-axis direction. When the electric field or magnetic field is removed from between the lower electrode 520 and the upper electrode 540, the stiffness of the variable fluid is reduced and therefore the variable fluid returns to the low viscosity state.

Figure 6A:
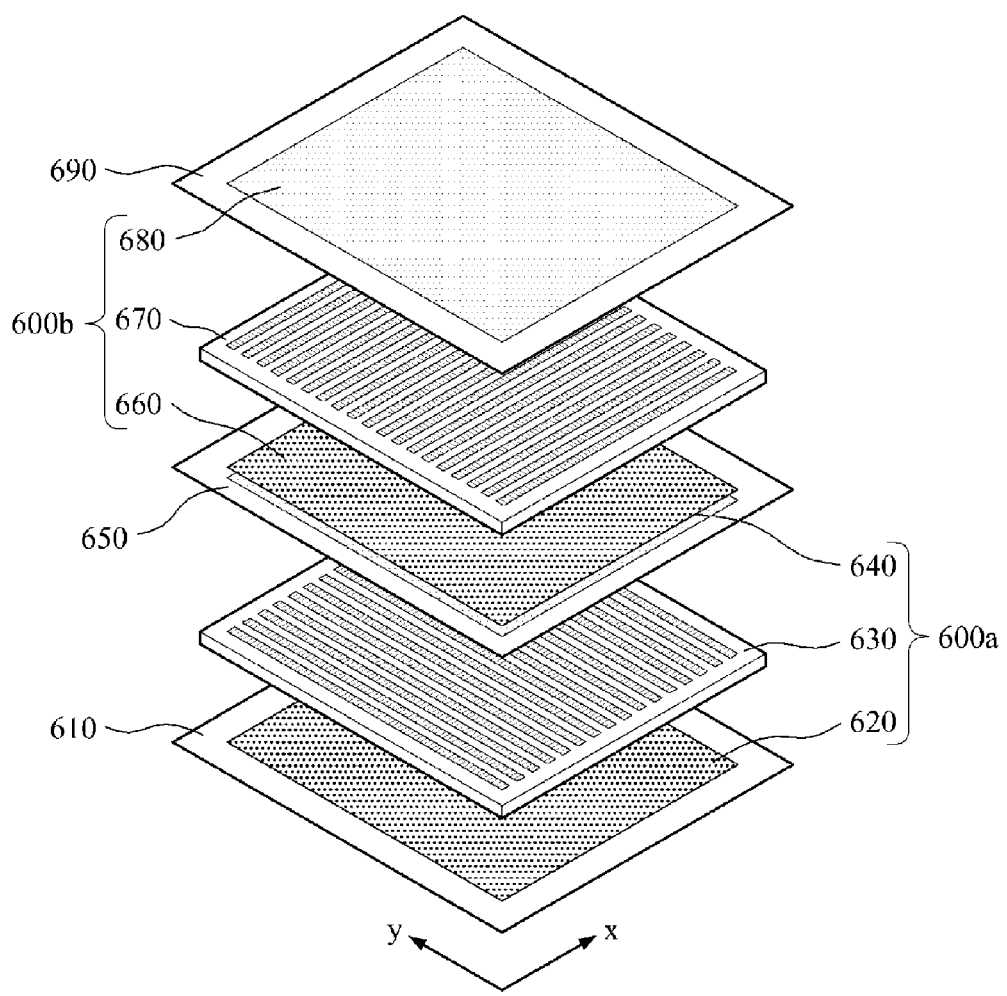
FIG. 6A illustrates a perspective view of a variable stiffness film according to example embodiments.
Figure 6B:
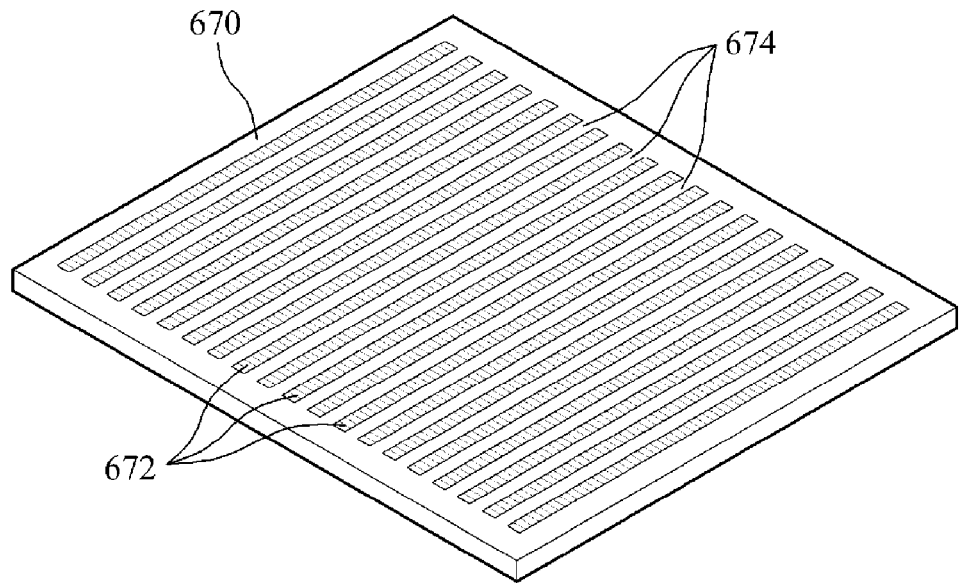
FIG. 6B illustrates a perspective view of variable fluid layers of a variable stiffness film according to example embodiments.
Figure 6B:
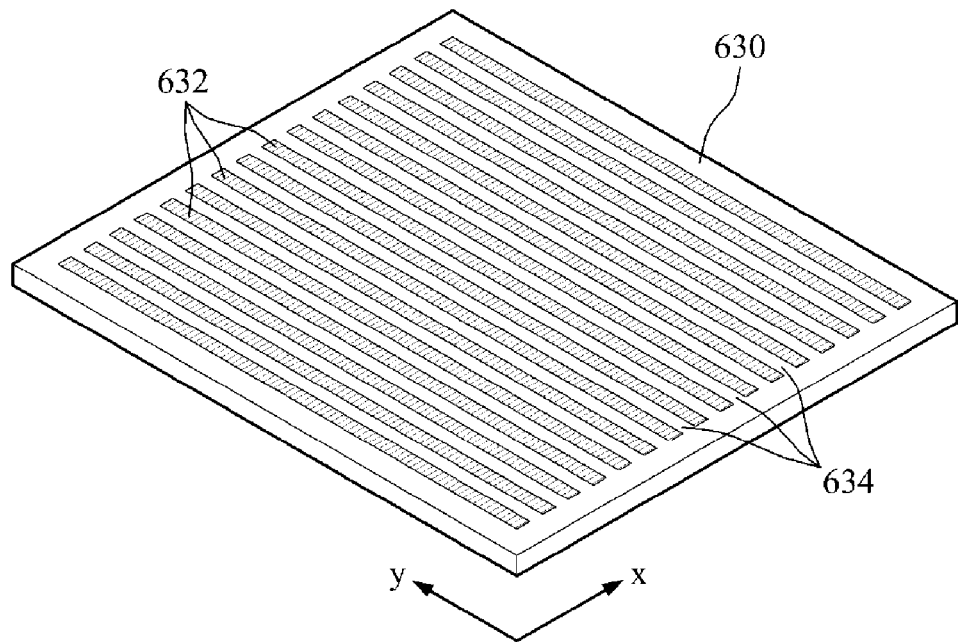
Figure 6C:
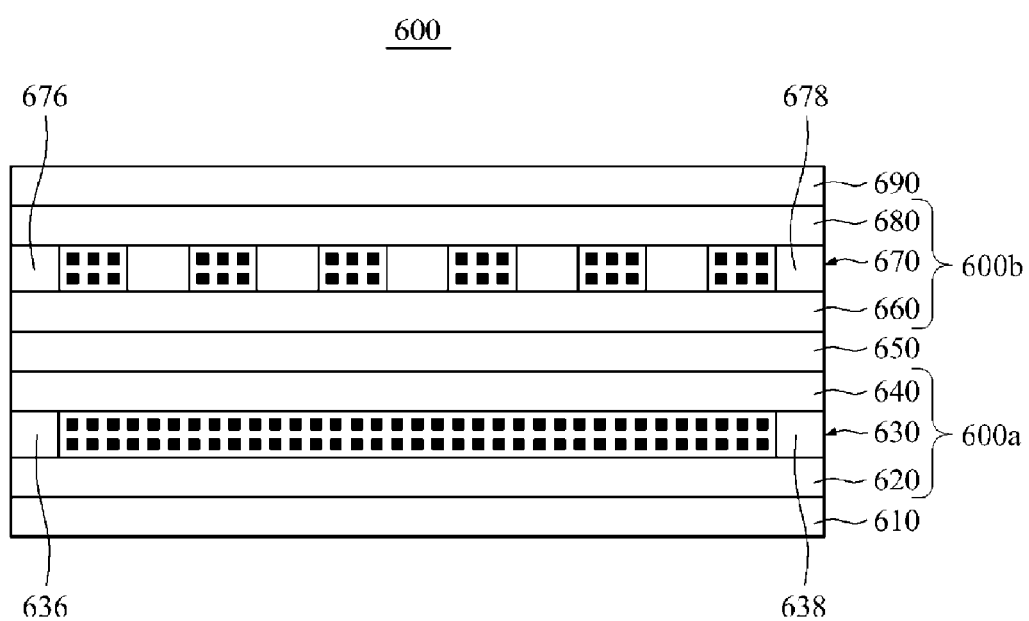
FIG. 6C illustrates a sectional view of a variable stiffness film according to example embodiments.

FIG. 6A illustrates a perspective view of a variable stiffness film 600 according to example embodiments. FIG. 6B illustrates a perspective view of variable fluid layers of the variable stiffness film 600. FIG. 6C illustrates a sectional view of the variable stiffness film 600.

Referring to FIGS. 6A to 6C, the variable stiffness film 600 may include a first variable stiffness layer 600a, a second variable stiffness layer 600b, and a polymer separation layer 650 disposed between the first variable stiffness layer 600a and the second variable stiffness layer 600b. In detail, the variable stiffness film 600 may include a first lower electrode 620 of the first variable stiffness layer 600a disposed on a first lower polymer layer 610, a first variable fluid layer 630 disposed on the first lower electrode 620, first sealing portions 636 and 638 disposed at opposite sides of the first variable fluid layer 630, a first upper electrode 640 disposed on the first variable fluid layer 630, the polymer separation layer 650 disposed on the first upper electrode 640, a second lower electrode 660 of the second variable stiffness layer 600b disposed on the polymer separation layer 650, a second variable fluid layer 670 disposed on the second lower electrode 660, second sealing portions 676 and 678 disposed at opposite sides of the second variable fluid layer 670, a second upper electrode 680 disposed on the second variable fluid layer 670, and a second upper polymer layer 690 disposed on the second upper electrode 680.

The variable fluid layer 630 may include supporting polymer patterns 634 for supporting the plurality of variable fluid receiving portions 632. When the variable fluid receiving portions 632 and the supporting polymer patterns 634 are included, sealing portions may be omitted because the supporting polymer patterns 634 may function as the sealing portions.

The variable fluid layer 670 may include supporting polymer patterns 674 for supporting the plurality of variable fluid receiving portions 672. When the variable fluid receiving portions 672 and the supporting polymer patterns 674 are included, sealing portions may be omitted because the supporting polymer patterns 674 may function as the sealing portions.

A plurality of variable fluid receiving portions 632 of the first variable fluid layer 630 of the first variable stiffness layer 600a and a plurality of variable fluid receiving portions 672 of the second variable fluid layer 670 of the second variable stiffness layer 600b may be orthogonal to each other. As shown in FIGS. 6A and 6B, the variable fluid receiving portions 632 of the first variable fluid layer 630 of the first variable stiffness layer 600a may be arranged in the Y-axis direction whereas the variable fluid receiving portions 672 of the second variable fluid layer 670 of the second variable stiffness layer 600b are arranged in the X-axis direction.

When the electric or magnetic field is generated between the first lower electrode 620 and the first upper electrode 640 of the first variable stiffness layer 600a, because a variable fluid of the variable fluid receiving portions 632 disposed between two electrodes is arranged in the Y-axis direction, the stiffness may increase in the Y-axis direction but may not significantly change in the X-axis direction. In addition, when the electric or magnetic field is generated between the second lower electrode 660 and the second upper electrode 680 of the second variable stiffness layer 600b, because a variable fluid of the variable fluid receiving portions 672 disposed between two electrodes is arranged in the X-axis direction, the stiffness may increase in the X-axis direction but may not significantly change in the Y-axis direction. Therefore, the first variable stiffness layer 600a and the second variable stiffness layer 600b may be controlled to have the stiffness simultaneously or independently.

Figure 7A:
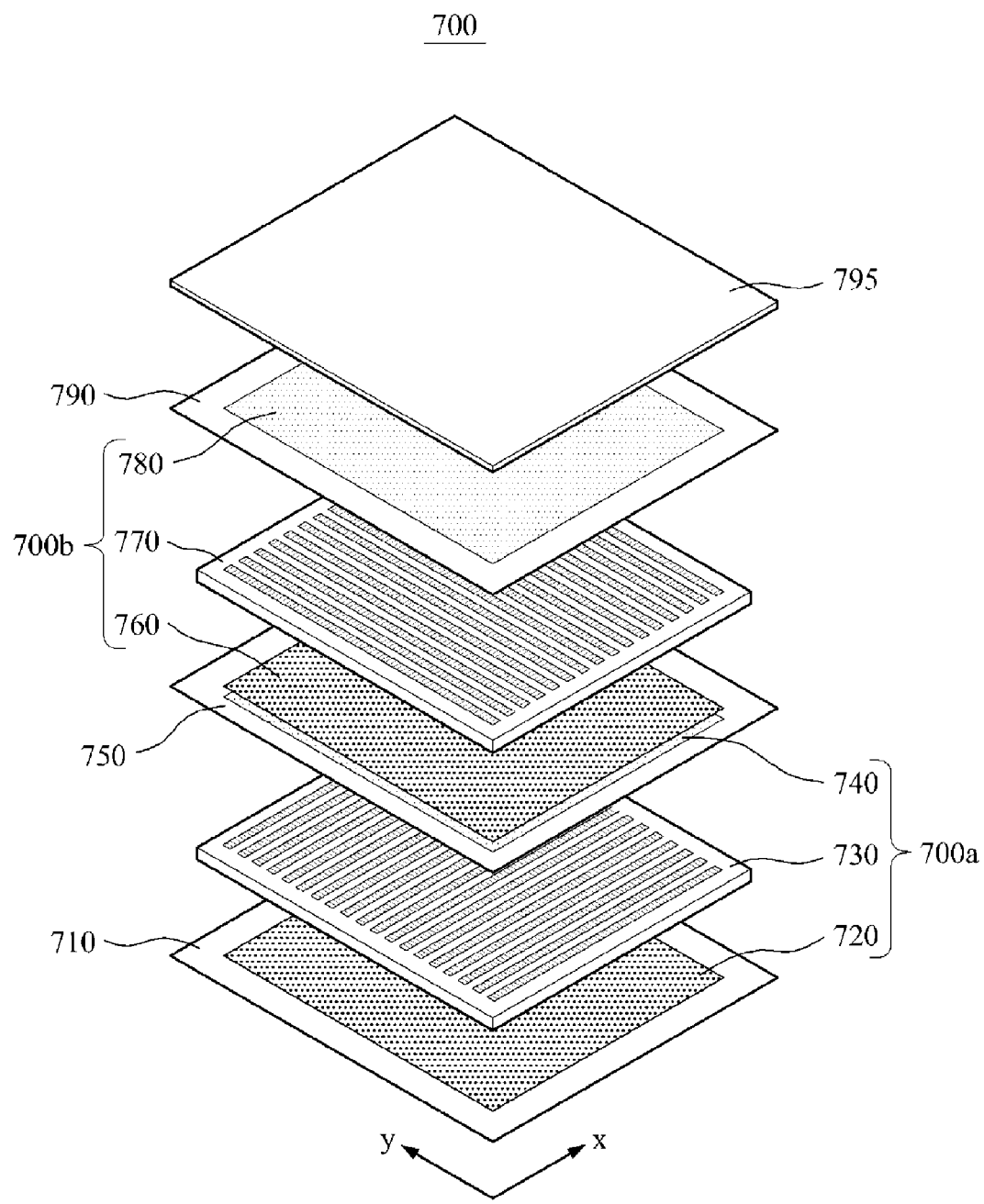
FIG. 7A illustrates a perspective view of a variable stiffness flexible display according to example embodiments.
Figure 7B:
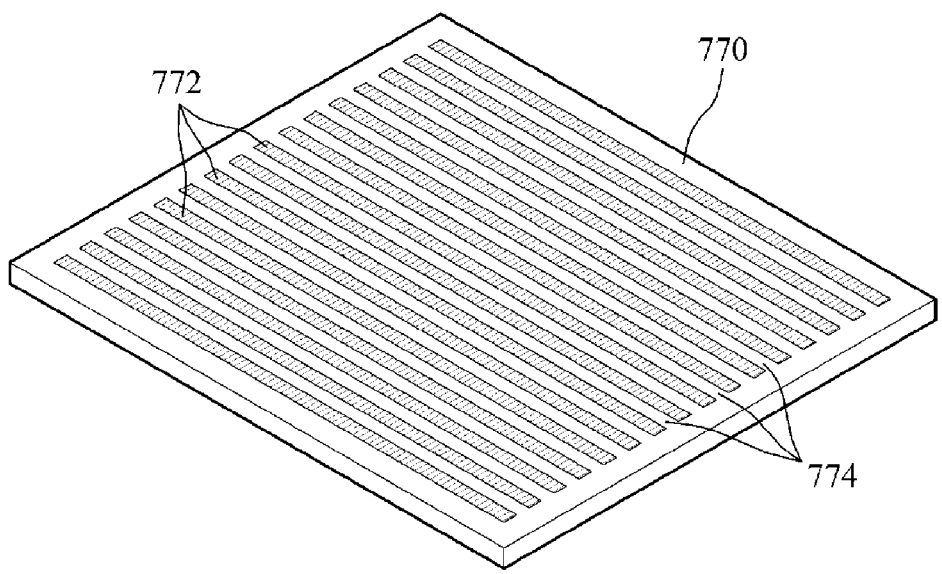
FIG. 7B illustrates a perspective view of variable fluid layers of a variable stiffness flexible display according to example embodiments.
Figure 7B:
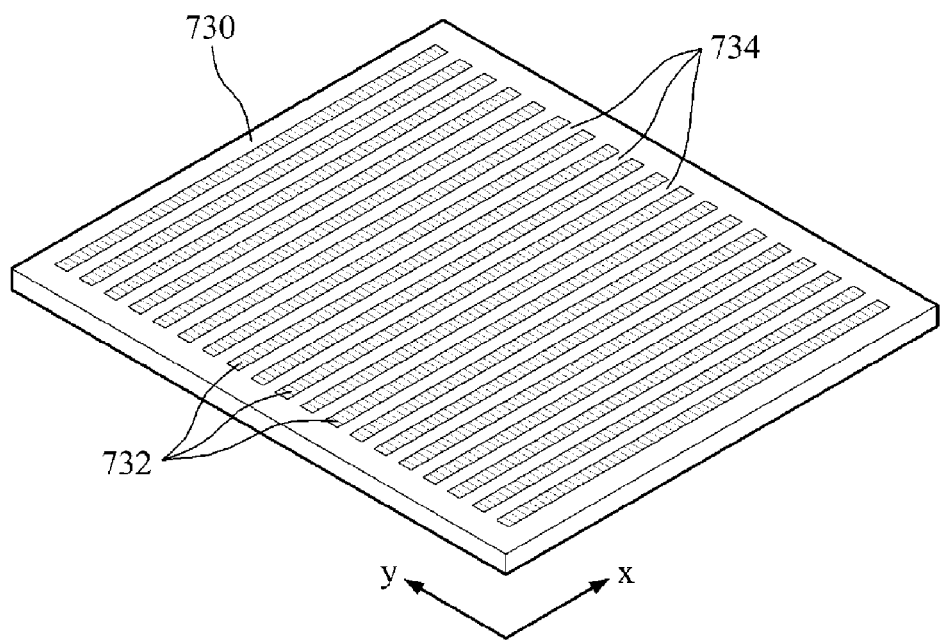
Figure 7C:
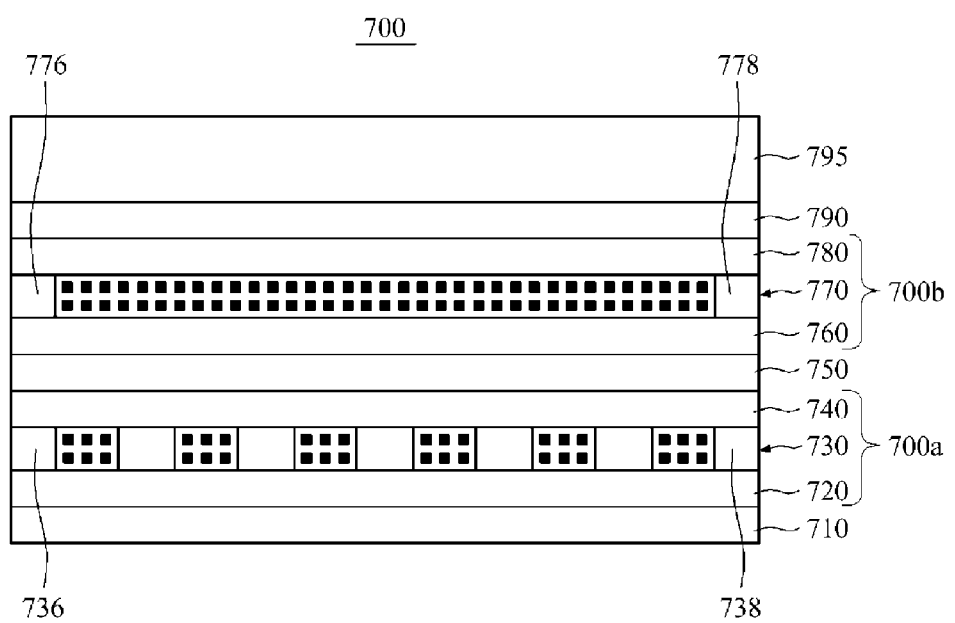
FIG. 7C illustrates a sectional view of a variable stiffness flexible display according to example embodiments.

FIG. 7A illustrates a perspective view of a variable stiffness flexible display 700 according to example embodiments. FIG. 7B illustrates a perspective view of variable fluid layers of the variable stiffness flexible display 700. FIG. 7C illustrates a sectional view of the variable stiffness flexible display 700.

Referring to FIGS. 7A to 7C, the variable stiffness flexible display 700 may include a first variable stiffness layer 700a, a second variable stiffness layer 700b, a polymer separation layer 750 disposed between the first variable stiffness layer 700a and the second variable stiffness layer 700b, and a flexible display 795. In detail, the variable stiffness flexible display 700 may include a first lower electrode 720 of the first variable stiffness layer 700a disposed on a first lower polymer layer 710, a first variable fluid layer 730 disposed on the first lower electrode 720, first sealing portions 736 and 738 disposed at opposite sides of the first variable fluid layer 730, a first upper electrode 740 disposed on the first variable fluid layer 730, the polymer separation layer 750 disposed on the first upper electrode 740, a second lower electrode 760 of the second variable stiffness layer 700b disposed on the polymer separation layer 750, a second variable fluid layer 770 disposed on the second lower electrode 760, second sealing portions 776 and 778 disposed at opposite sides of the second variable fluid layer 770, a second upper electrode 780 disposed on the second variable fluid layer 770, a second upper polymer layer 790 disposed on the second upper electrode 780, and the flexible display 795.

The first variable fluid layer 730 and the second variable fluid layer 770 may include a plurality of first variable fluid receiving portions 732 and a plurality of second variable fluid receiving portions 772, respectively, which are patterned to be parallel with each other and configured to receive a variable fluid. Also, the first variable fluid layer 730 and the second variable fluid layer 770 may include first supporting polymer patterns 734 and second supporting polymer patterns 774 for supporting the first variable fluid receiving portions 732 and the second variable fluid receiving portions 772, respectively. A plurality of variable fluid receiving portions 732 of the first variable fluid layer 730 of the first variable stiffness layer 700a and a plurality of variable fluid receiving portions 772 of the second variable fluid layer 770 of the second variable stiffness layer 700b may be orthogonal to each other. The variable stiffness film 700 according to the example embodiments, different from the variable stiffness film 600 of FIGS. 6A to 6C, the variable fluid receiving portions 732 of the first variable fluid layer 730 of the first variable stiffness layer 700a may be arranged in the X-axis direction whereas the variable fluid receiving portions 772 of the second variable fluid layer 770 of the second variable stiffness layer 700b are arranged in the Y-axis direction.

When the electric or magnetic field is generated between the first lower electrode 720 and the first upper electrode 740 of the first variable stiffness layer 700a, because a variable fluid of the variable fluid receiving portions 732 disposed between two electrodes is arranged in the X-axis direction, the stiffness may increase in the X-axis direction but may not significantly change in the Y-axis direction. In addition, when the electric or magnetic field is generated between the second lower electrode 760 and the second upper electrode 780 of the second variable stiffness layer 700b, because a variable fluid of the variable fluid receiving portions 772 disposed between two electrodes is arranged in the Y-axis direction, the stiffness may increase in the Y-axis direction but may not significantly change in the X-axis direction. Therefore, the first variable stiffness layer 700a and the second variable stiffness layer 700b may be controlled to have the stiffness simultaneously or independently.

The variable stiffness flexible display according to example embodiments may be equivalent to the variable stiffness film 600 shown in FIGS. 6A to 6C, in which the flexible display 795 is further included. Although the flexible display 795 is disposed on the second upper polymer layer 790 in FIGS. 7A to 7C, the flexible display 795 may be disposed on the first lower polymer layer 710.

For example, the flexible display 795 may be a watch, an LCD, an OLED, a PDP, or e-paper.

Figure 8:
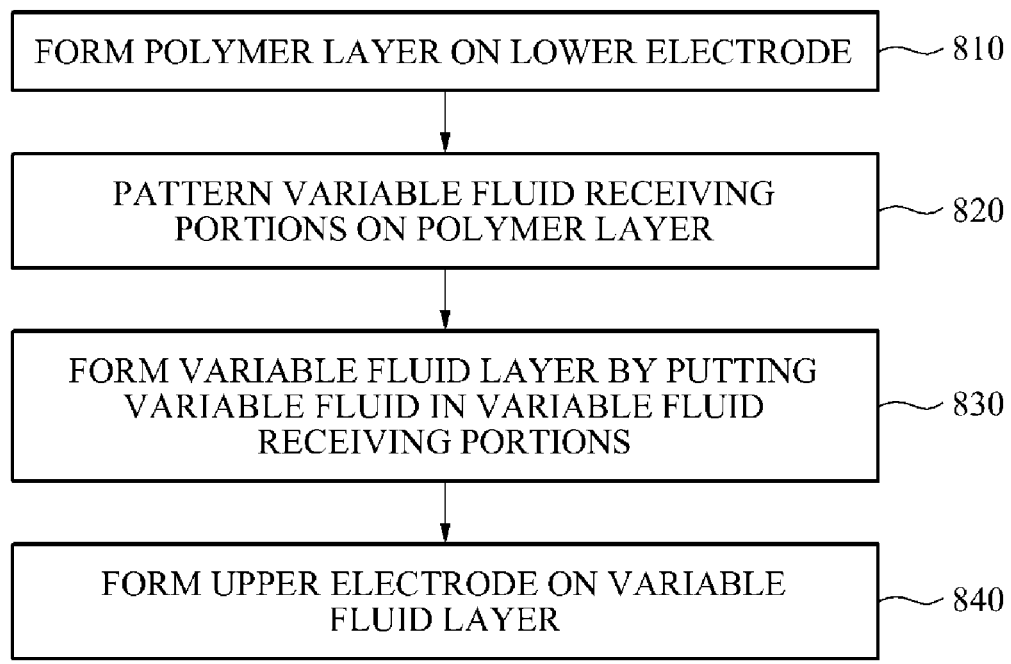
FIG. 8 illustrates a flowchart of a manufacturing method for a variable stiffness film according to example embodiments.

FIG. 8 illustrates a flowchart of a manufacturing method for a variable stiffness film according to example embodiments. The manufacturing method for the variable stiffness film will be described with reference to FIG. 8.

The manufacturing method may include forming a polymer layer on a lower electrode in operation 810, patterning a plurality of variable fluid receiving portions arranged in parallel with each other on the polymer layer in operation 820, forming a variable fluid layer by putting a variable fluid in the variable fluid receiving portions in operation 830, and forming an upper electrode on the variable fluid layer in operation 840.

In detail, in operation 810, the polymer layer may be formed on the lower electrode.

For example, the lower electrode may include ITO, IZO, TAO, TO, ZnO, graphene, CNT, and silver nanowire.

For example, the polymer layer may include at least a thermosetting resin such as PI, polyacryl, polyphenol, polyester, and polyurethane, a thermoplastic resin such as polycarbonate, polyethylene, and polystyrene, BCB, an F-added PI, PFCB, FPAE, and a siloxane based polymer.

In operation 820, the variable fluid receiving portions may be patterned on the polymer layer.

The polymer layer may have thickness of approximately 500 μm or less.

The patterning of the variable fluid receiving portions may include patterning of the plurality of variable fluid receiving portions arranged in parallel with each other.

In operation 830, the variable fluid layer may be formed by putting the variable fluid in the variable fluid receiving portions.

The variable fluid may include an ER fluid or an MR fluid.

In operation 840, the upper electrode may be formed on the variable fluid layer.

A material of the upper electrode may be same as or different from a material of the lower electrode.

The lower electrode may be shaped corresponding to the variable fluid receiving portions. Spaces between the lower electrodes may be filled with polymer. The forming of the upper electrode may form the upper electrode corresponding to the variable fluid receiving portions.

After the forming of the upper electrode, additional operations may be performed, such as forming a polymer separation layer on the upper electrode, forming a second lower electrode on the polymer separation layer, forming a second polymer layer on the second lower electrode, patterning a plurality of second variable fluid receiving portions arranged in parallel with each other orthogonally to the plurality of variable fluid receiving portions, forming a second variable fluid layer by putting the variable fluid in the second variable fluid receiving portions, and forming a second upper electrode on the second variable fluid layer, for example. The second lower electrode may be shaped corresponding to the second variable fluid receiving portions. Spaces between the second lower electrodes are filled with polymer. The forming of the second upper electrode may form the second upper electrode corresponding to the second variable fluid receiving portions.

Figure 9A:
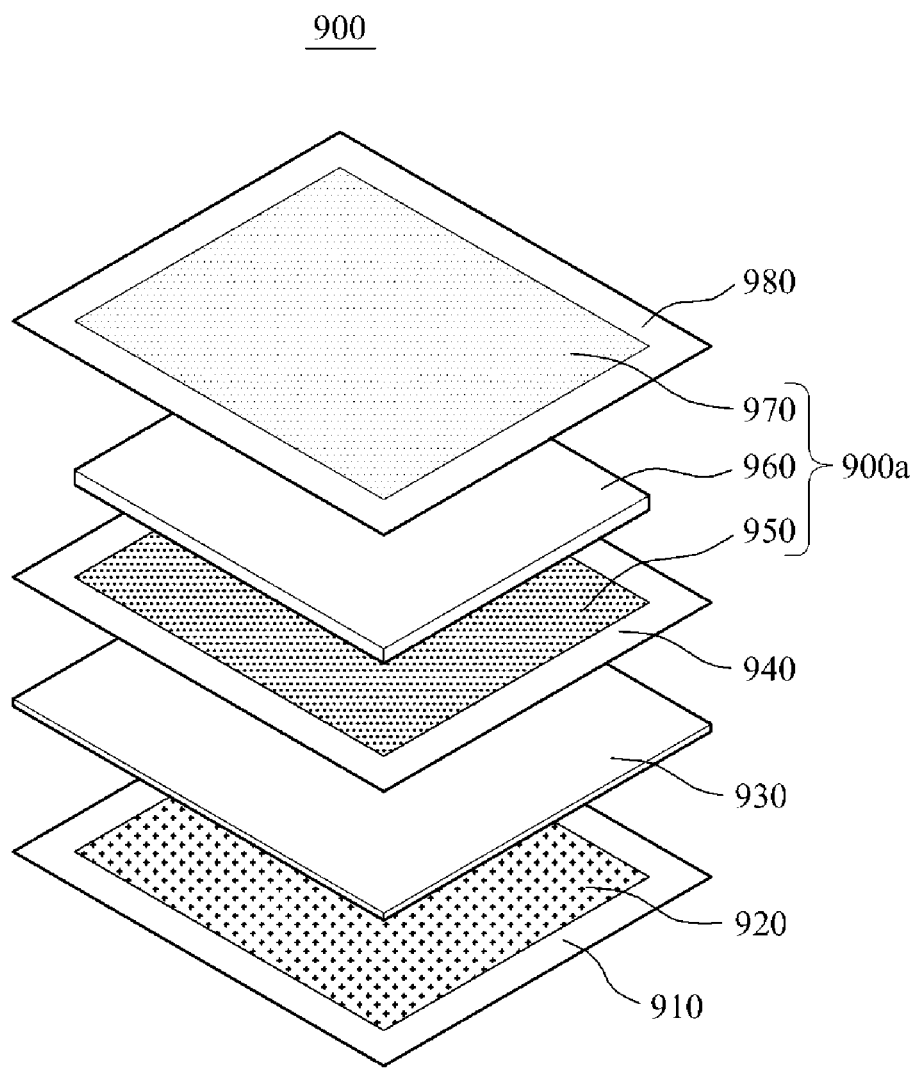
FIG. 9A illustrates a perspective view of a variable stiffness flexible touch sensor according to example embodiments.
Figure 9B:
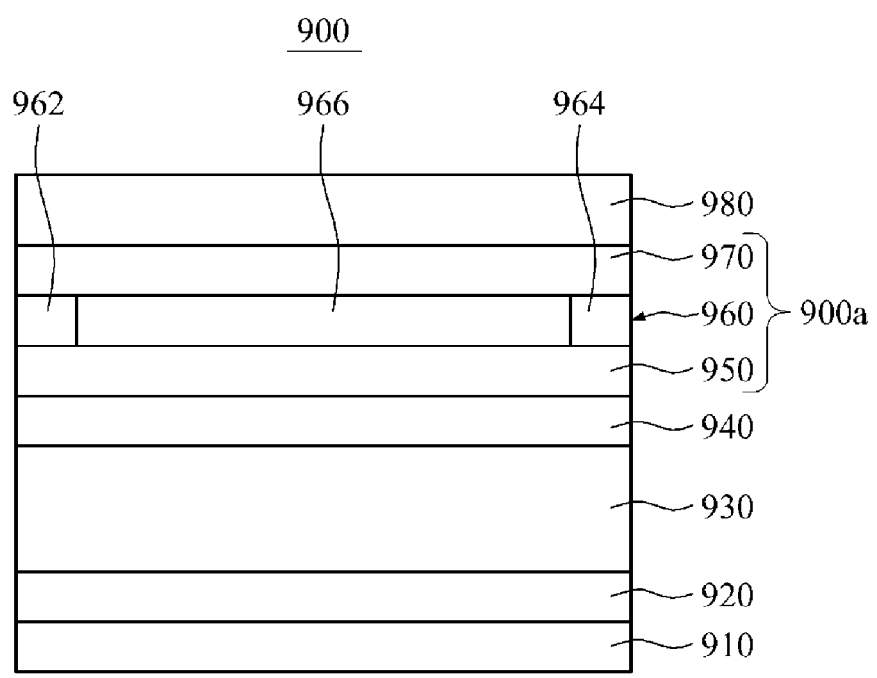
FIG. 9B illustrates a sectional view of a variable stiffness flexible touch sensor according to example embodiments.

FIG. 9A illustrates a perspective view of a variable stiffness flexible touch sensor 900 according to example embodiments. FIG. 9B illustrates a sectional view of the variable stiffness flexible touch sensor 900.

Referring to FIGS. 9A and 9B, the variable stiffness flexible touch sensor 900 may include a protection layer 910, a touch sensor 920, a flexible display 930, and a variable stiffness layer 900a that includes a lower electrode 950, a variable fluid layer 960, and an upper electrode 970. In detail, the variable stiffness flexible touch sensor 900 may include the touch sensor 920 disposed on the protection layer 910, the flexible display 930 disposed on the touch sensor 920, a lower polymer layer 940 disposed on the flexible display 930, the lower electrode 950 disposed on the lower polymer layer 940, the variable fluid layer 960 disposed on the lower electrode 950, the upper electrode 970 disposed on the variable fluid layer 960, and an upper polymer layer 980 disposed on the upper electrode 970.

The variable fluid layer 960 may include variable a fluid receiving portion 966 configured to receive a variable fluid. When the variable fluid receiving portion 966 are in a recess form and may further include sealing portions 962 and 964 on opposite sides of the variable fluid layer 960 to prevent the variable fluid from flowing out.

The touch sensor 920 may include a resistive type touch sensor that senses a change in a current or voltage value through a position pushed by a pressure in a state in which a direct voltage is applied, and a capacitive type touch sensor that uses capacitance coupling in a state in which an alternating voltage is applied.

The protection layer 910 and the touch sensor 920 are disposed at a lower portion of the flexible display 930 in FIGS. 9A and 9B. However, the disclosure is not limited thereto, and the protection layer 910 and the touch sensor 920 may be disposed on the upper polymer layer 980. The protection layer 910 may include a polymer layer and the touch sensor 920 may include a touch sensing electrode layer. The polymer layer and the touch sensing electrode layer may be disposed at the lower portion of the flexible display 930 or on the upper polymer layer 980.

In the capacitive type touch sensor, the flexible display 930 may include a touch sensing electrode layer, a polymer layer, another touch sensing electrode layer, and another polymer layer disposed at the lower portion in sequence. Alternatively, the upper polymer layer 980 may include a touch sensing electrode layer, a polymer layer, another touch sensing electrode layer, and another polymer layer disposed at the upper portion in sequence.

For example, the flexible display 930 may be a watch, an LCD, an OLED, a PDP, or e-paper.

Figure 10A:
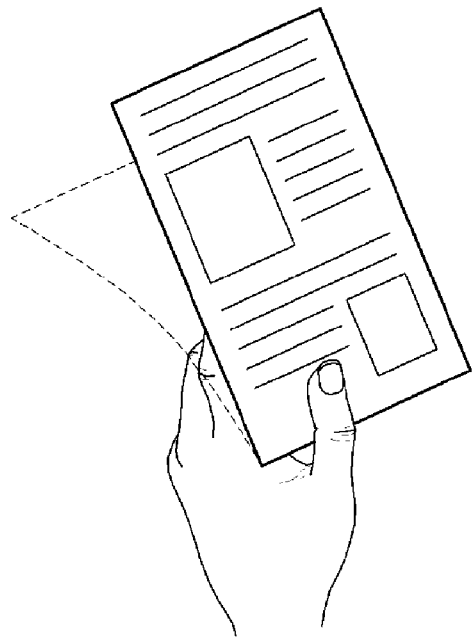
FIG. 10A illustrates a state in which a screen of a variable stiffness flexible display according to example embodiments is read.

FIG. 10A illustrates a state in which a screen of a variable stiffness flexible display according to example embodiments is read. Through the screen of the variable stiffness flexible display such as an LCD, OLED, PDP, and e-paper, the screen may be fixed without bending, maintaining the stiffness in one direction, during the screen reading.

Figure 10B:
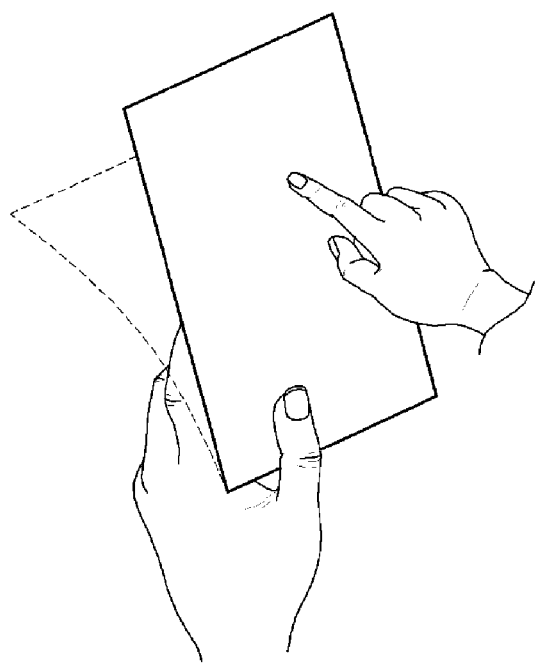
FIG. 10B illustrates a state in which a touch input is performed with respect to a variable stiffness flexible display, according to example embodiments.

FIG. 10B illustrates a state in which a touch input is performed with respect to a variable stiffness flexible display, according to example embodiments. Through the screen of the variable stiffness flexible display such as an LCD, OLED, PDP, and e-paper, the screen may be rigid, maintaining the stiffness in one direction, during or following a touch input by a pointing object such as a finger.

Figure 11:
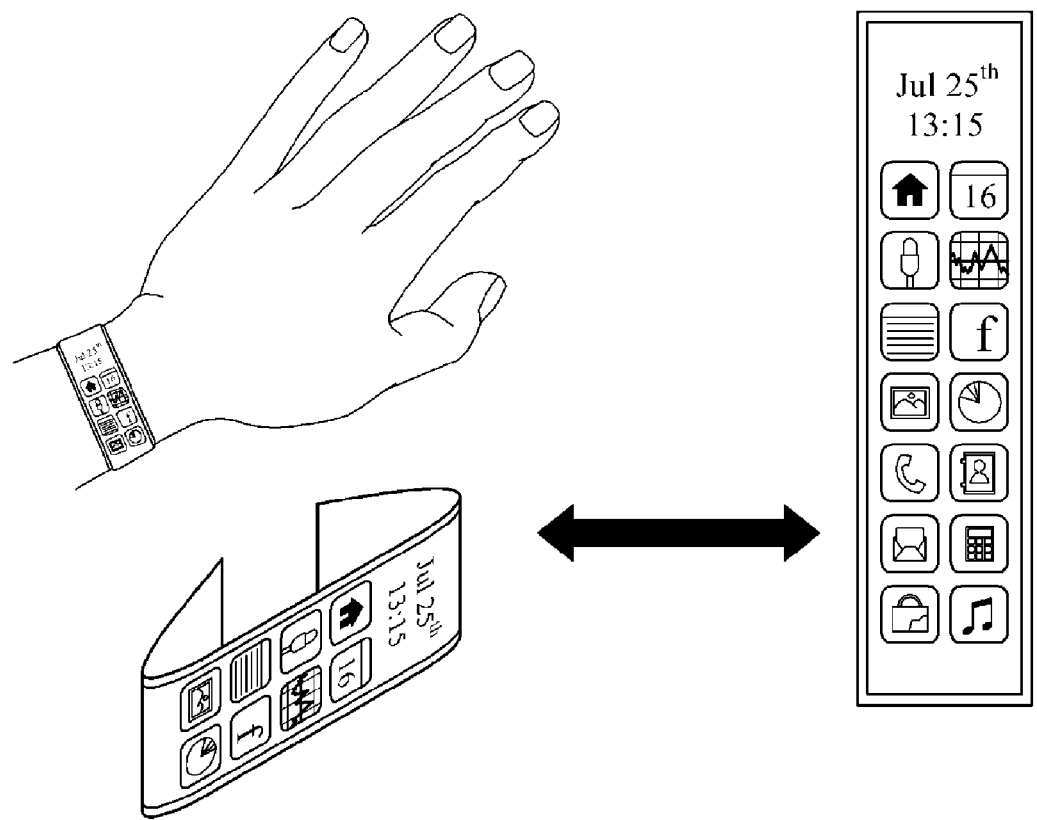
FIG. 11 illustrates an example of using a variable stiffness flexible display according to example embodiments as a watch.

FIG. 11 illustrates an example that a variable stiffness flexible display according to example embodiments, is used as a watch. The variable stiffness flexible display is transformed to be worn on a wrist. A stiffness of the variable stiffness flexible display may be increased using an ER fluid or MR fluid provided in the variable stiffness flexible display to hold the shape of the watch worn on the wrist. Thus, the variable stiffness flexible display may be worn like a watch. In this state, when a user wants to view the screen in a wide form, the user may decrease the resistance, unroll the screen flat, and increase the stiffness of the variable stiffness flexible display using the ER fluid or MR fluid, thereby fixing the variable stiffness flexible display in the flat position.

The above-described embodiments may be recorded in computer-readable media including program instructions to implement various operations embodied by a computer. The media may also include, alone or in combination with the program instructions, data files, data structures, and the like. The program instructions recorded on the media may be those specially designed and constructed for the purposes of embodiments, or they may be of the kind well-known and available to those having skill in the computer software arts. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. The computer-readable media may also be a distributed network, so that the program instructions are stored and executed in a distributed fashion. The program instructions may be executed by one or more processors. The computer-readable media may also be embodied in at least one application specific integrated circuit (ASIC) or Field Programmable Gate Array (FPGA), which executes (processes like a processor) program instructions. Examples of program instructions include both machine code, such as produced by a compiler, and files containing higher level code that may be executed by the computer using an interpreter. The above-described devices may be configured to act as one or more software modules in order to perform the operations of the above-described embodiments, or vice versa.

Although example embodiments have been shown and described, it would be appreciated by those skilled in the art that changes may be made in these example embodiments without departing from the principles and spirit of the disclosure, the scope of which is defined in the claims and their equivalents.

What is claimed is:

1. A variable stiffness film, comprising:
a variable stiffness layer comprising:
   a lower electrode;
   a first variable fluid layer disposed on the lower electrode;
   an upper electrode disposed on the first variable fluid layer; and
   a second variable fluid layer disposed above the first variable fluid layer,
wherein the first variable fluid layer comprises a plurality of first variable fluid receptacles that are arranged in a first pattern that respectively comprise a first variable fluid,
the second variable fluid layer comprises a plurality of second variable fluid receptacles that are arranged in a second pattern, orthogonal to the first pattern, that respectively comprise a second variable fluid,
the lower electrode or the upper electrode are arranged in a third pattern, and
each variable fluid of the first variable fluid and the second variable fluid has a change in stiffness when one of an electric field and a magnetic field is generated between the upper electrode and the lower electrode.

2. The variable stiffness film of claim 1, wherein the first variable fluid layer comprises:
patterns of a plurality of supporting polymers to support the plurality of first variable fluid receptacles.

3. The variable stiffness film of claim 2, wherein
the variable stiffness layer further comprises a polymer separation layer disposed between the first variable fluid layer and the second variable fluid layer,
and the first variable fluid layer and the second variable fluid layer are controllable to have stiffness, respectively.

4. The variable stiffness film of claim 2, wherein
the lower electrode and the upper electrode are arranged in the third pattern, and
the plurality of supporting polymers are respectively arranged between the plurality of first variable fluid receptacles.

5. The variable stiffness film of claim 1, wherein the first variable fluid is at least one of an electro-rheological (ER) fluid and a magneto-rheological (MR) fluid.

6. The variable stiffness film of claim 1, wherein the lower electrode and the upper electrode each comprise at least indium tin oxide (ITO), indium zinc oxide (IZO), tin antinomy oxide (TAO), tin oxide (TO), zinc oxide (ZnO), graphene, carbon nanotube (CNT), and silver nanowire.

7. The variable stiffness film of claim 1, further comprising a polymer layer disposed on at least one of the upper electrode and the lower electrode.

8. The variable stiffness film of claim 1, further comprising sealing portions disposed on opposite sides of the first variable fluid layer.

9. The variable stiffness film of claim 1, wherein both the lower electrode and the upper electrode are arranged in the third pattern.

10. The variable stiffness film of claim 1, wherein the variable stiffness film further comprises a flexible display layer disposed on the upper electrode, and
the variable stiffness film, comprising the variable stiffness layer and the flexible display layer, is flexible when the one of the electric field and the magnetic field is not generated.

11. A variable stiffness flexible display, comprising:
a flexible display; and
variable stiffness films disposed below the flexible display, each of the variable stiffness films comprising:
   a lower electrode;
   a variable fluid layer disposed on the lower electrode; and
   an upper electrode disposed on the variable fluid layer,
wherein the variable fluid layer comprises a plurality of variable fluid receptacles that are arranged in a pattern and that respectively comprise a variable fluid,
the variable fluid has a change in stiffness when one of an electric field and a magnetic field is generated between the upper electrode and the lower electrode, and
when the one of the electric field and the magnetic field is generated, the stiffness of each of the variable stiffness films is increased using the variable fluid to hold a shape and when the one of the electric field and the magnetic field is removed using the variable fluid, the stiffness of each of the variable stiffness films returns to an original flexible state, and
wherein the plurality of variable fluid receptacles of a first variable stiffness film of the variable stiffness films and the plurality of variable fluid receptacles of a second variable stiffness film of the variable stiffness films are arranged, at intermediate portions thereof, in directions different from each other.

12. A variable stiffness flexible touch sensor, comprising:
a flexible display;
a touch sensor;
variable stiffness films disposed below the flexible display, each of the variable stiffness films comprising:
   a lower electrode;
   a variable fluid layer disposed on the lower electrode; and
   an upper electrode disposed on the variable fluid layer,
wherein the variable fluid layer comprises a plurality of variable fluid receptacles that are arranged in a pattern and that respectively comprise a variable fluid,
the variable fluid has a change in stiffness when one of an electric field and a magnetic field is generated between the upper electrode and the lower electrode, and
when the one of the electric field and the magnetic field is generated, the stiffness of each of the variable stiffness films is increased using the variable fluid to hold a shape and when the one of the electric field and the magnetic field is removed using the variable fluid, the stiffness of each of the variable stiffness films returns to an original flexible state, and
wherein the plurality of variable fluid receptacles of a first variable stiffness film of the variable stiffness films and the plurality of variable fluid receptacles of a second variable stiffness film of the variable stiffness films are arranged, at intermediate portions thereof, in directions different from each other.

* * * * *